United States Patent
Ahmed et al.

(10) Patent No.: US 6,809,523 B1
(45) Date of Patent: Oct. 26, 2004

(54) ON-LINE DETECTION OF PARTIAL DISCHARGE IN ELECTRICAL POWER SYSTEMS

(75) Inventors: Nezar Ahmed, Chesterfield, MI (US); Nago Srinivas, Farmington Hills, MI (US)

(73) Assignee: The Detroit Edison Company, Detroit, MI (US)

( * ) Notice: Subject to any disclaimer, the term of this patent is extended or adjusted under 35 U.S.C. 154(b) by 878 days.

(21) Appl. No.: 09/174,032

(22) Filed: Oct. 16, 1998

(51) Int. Cl.$^7$ .............................................. G01R 31/08

(52) U.S. Cl. ..................................................... 324/520

(58) Field of Search ................................ 324/520, 522, 324/523, 529, 535, 536, 544, 546, 551, 772; 310/214, 220

(56) References Cited

U.S. PATENT DOCUMENTS

| | | | | |
|---|---|---|---|---|
| 4,949,001 A | * | 8/1990 | Campbell | 310/220 |
| 5,214,595 A | * | 5/1993 | Ozawa et al. | 364/551.01 |
| 5,475,312 A | * | 12/1995 | Sedding et al. | 324/536 |
| 5,933,012 A | * | 8/1999 | Bengtsson | 324/524 |
| 5,982,181 A | * | 11/1999 | Rokunohe et al. | 324/551 |

OTHER PUBLICATIONS

N.H. Ahmed and N.N. Srinivas, "On–Line Patent Discharge Detection in Cables," IEEE Transactions, vol. 5, No. 2, Apr. 1998, pp. 181–188.
N.H. Ahmed and N.N. Srinivas, "On–Line Patent Discharge Detection in Transformer".
N.H. Ahmed and N.N. Srinivas, "On–Line Partial Discharge Detection in Cables," IEEE Annual Report, Oct. 19, 1997, pp. 215–217.
P. VonGlahn and R.J. Van Brunt, "Continuous Recording and Stochastic Analysis of PD," IEEE Trans. on Dielectric and Electrical Insulation, vol. 2, No. 4, pp. 590–601, 1995.
G. C. Stone, "The Use of Partial Discharge Measurements to Assess the Condition of Rotating Machine Insulation," IEEE Electrical Insulation Magazine, vol. 12, No. 4, pp. 23–27, 1996.
E. Gulski, "Computer–aided Measurement of Partial Discharges in HV Equipment," IEEE Trans. on Electrical Insulation, vol. 28, No. 6, pp. 969–983, 1993.
G. C. Stone, T.E. Goodeve, H.G. Sedding and W. McDermid, "Usual PD Pulse Phase Distributions in Operating Rotating Machines," IEEE Trans. on Dielectric and Electrical Insulation, vol. 2, No. 4, pp. 567–577, 1995.
J. Fuhr. M. Haessing, P. Boss, D. Tschudi and R.A. King, "Detection and Location of Internal Defects in the Insulation of Power Transformers," IEEE Trans. on Electrical Insulation, vol. 28, No. 6, pp. 1057–1067, 1993.
C.G. Henningsen, K. Polster, B.A. Fruth and D.W. Gross, Experience with an On–Line Monitoring System for 400 kV XLPE Cables, IEEE T & D Conference, Los Angeles, 1996.
E. Pultrum and T. Aabo, "Diagnostic Testing of Cable System," Pennsylvania Electric Assocation T & D Committee Meeting, Sep. 1996.

(List continued on next page.)

Primary Examiner—Safet Metjahic
Assistant Examiner—Etienne P LeRoux
(74) Attorney, Agent, or Firm—Reising, Ethington, Barnes, Kisselle, P.C.

(57) ABSTRACT

A method and apparatus for on-line detection of partial discharge events in an a.c. power system, in which high frequency electromagnetic pulses generated by partial discharge events are detected and analyzed in the frequency domain and the time domain to determine the type and location of the partial discharge event. The phase relationship between the partial discharge events and the on-line power signal is also examined to help indicate severity of the insulation anomaly giving rise to the partial discharge events.

5 Claims, 2 Drawing Sheets

OTHER PUBLICATIONS

N. De Kock, B. Coric and R. Pietsch, "UHF PD Detection in Gas–Insulated Switchgear–Suitability and Sensitivity of the UHF Method in Comparison with the IEC 270 Method," IEEE Electrical Insulation Magazine, vol. 12, No. 6, pp. 20–25, 1996.

A.G. Sellars S.J. MacGregor and O. Farish, "Calibrating the UHF Technique of Partial Discharge Detection Using a PD Simulator," IEEE Trans. on Dielectric and Electrical Insulation, vol. 2, No. 1 pp. 46–53, 1995.

A.G. Sellars, O. Farish B.F. Hampton and L.S. Pritchard, "Using the UHF Technique to Investigate PD Producted by Defects in Solid Insulation," IEEE Trans. on Dielectric and Electrical Insulation, vol. 2, No. 3 pp. 448–459, 1995.

J.E. Pearson B.F. Hampton and A.G. Sellars, "A Continuous UHF Monitor for Gas Insulated Substation," IEEE Trans. on Electrical Insulation, vol. 26, No. 3, pp. 469–478, 1991.

* cited by examiner

ON-LINE DETECTION OF PARTIAL DISCHARGE IN ELECTRICAL POWER SYSTEMS

The present invention is directed to detection of partial discharge events in power systems such as cables, motors and transformers, and more particularly to a method and apparatus for detecting partial discharge events on-line while the power system is in operation.

BACKGROUND OF THE INVENTION

Partial discharge events in high-voltage power systems, such as high voltage power distribution cables, motors and transformers, are high-frequency discharges that take place in small portions of the system insulation. These discharges may have a duration on the order of ten to fifteen nanoseconds, and usually occur at a peak of the a.c. power cycle when electrical stress is highest within the insulation. Partial discharge events generate high frequency electromagnetic pulses that travel along the power systems.

High voltage equipment for use in electrical power systems is conventionally tested off-line for partial discharge activity that may indicate insulation defects and possible insulation failure. These conventional techniques typically involve coupling a capacitor in parallel with the equipment under test and measuring the discharge signals across an external impedance such as a resonant circuit. The resonant circuit expands the discharge current pulses in the time domain so that the pulses are easier to detect and measure. Both amplitude and phase of each partial discharge pulse may be recorded and analyzed relative to the test voltage. Apparatus of this character is not well suited for detection and analysis of partial discharge events in power systems while the systems are on-line.

It is therefore a general object of the present invention to provide a method and apparatus for detection and analysis of partial discharge events in an a.c. power system that are adapted for use on-line while the system is in operation, and that may be readily implemented for determining type and/or location of the partial discharges as they occur.

BRIEF DESCRIPTION OF THE DRAWINGS

The invention, together with additional objects, features and advantages thereof, will be best understood from the following description, the appended claims and the accompanying drawings in which:

DETAILED DESCRIPTION OF PREFERRED EMBODIMENTS

The disclosure in N. H. Ahmed and N. N. E. Srinivas, "On-line Partial Discharge Detection in Cables," *I.E.E.E. Transactions on Dielectrics and Electrical Insulation*, Vol. 5, No. 2, pp 181–188 (April 1998) is incorporated herein by reference for purposes of background.

Figure 1:
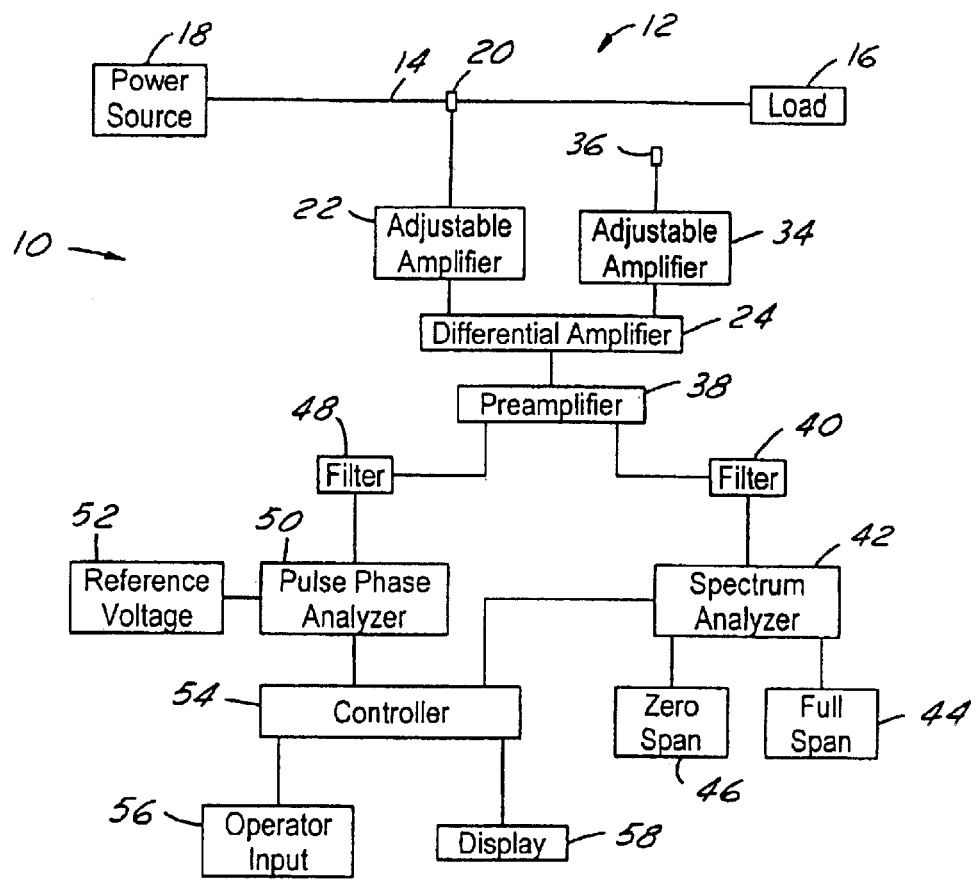
FIG. 1 is a functional block diagram of an apparatus for on-line detection of partial discharge events in an a.c. power system in accordance with a presently preferred embodiment of the invention.

FIG. 1 illustrates apparatus 10 in accordance with a presently preferred embodiment of the invention for detecting partial discharge events in an a.c. power system 12. For purposes of illustration, power system 12 is shown as comprising a cable 14 that connects a load 16 to a power source 18. Apparatus 10 is adapted to detect partial discharge events in cable 14 while system 12 is on-line—i.e., while power is being delivered by cable 14 from source 18 to load 16. Apparatus 10 is also adapted to detect partial discharge events in other conventional high-voltage equipment such as motors, transformers, gas-insulated systems and the like.

Figure 2:
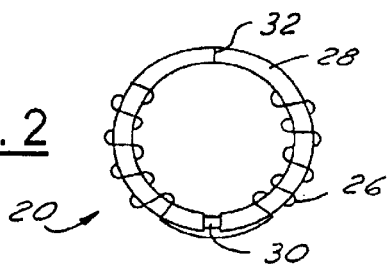
FIG. 2 is a schematic diagram of the inductive coupler in FIG. 1.

An inductive coupler 20 is operatively coupled to cable 14 for detecting high frequency electromagnetic pulses in cable 14 generated by partial discharge events, and feeding such pulses through an adjustable amplifier 22 to one input of a differential amplifier 24. One presently preferred embodiment of coupler 20 is illustrated in FIG. 2 as comprising a coil 26 mounted on a ferromagnetic core 28. Core 28 is of annular construction, having a hinge 30 and opposed abutting ends at 32 for opening the core so as to encompass cable 14. The electromagnetic pulses generated by partial discharge events in cable 14 are high-frequency electromagnetic pulses, typically in the VHF and UHF range. The UHF signals are dissipated very quickly in the power system, so coupler 20 preferably is adapted to be responsive to electromagnetic signals in the VHF range, and to exclude signals outside of this range, including the electrical power signal in cable 14 typically at sixty hertz in the U.S.

Differential amplifier 24 has a second input that receives a signal through an adjustable amplifier 34 from an antenna 36. Antenna 36 may be a loop or dipole antenna adapted to be responsive to electromagnetic interference in the surrounding atmosphere within the frequency range of inductive coupler 20—e.g., VHF radio signals. Within differential amplifier 24, the signals received from antenna 36 are subtracted from those received from coupler 20, so that the resulting output from the differential amplifier to a pre-amplifier 38 is indicative of the high frequency signals associated with partial discharge events from which the surrounding electromagnetic interference has been subtracted.

The output of pre-amplifier 38 is fed through a filter 40 to a spectrum analyzer 42. Spectrum analyzer 42 receives control inputs from a full span control 44 and a zero span control 46 for purposes to be described. The output of pre-amplifier 38 is also fed through a filter 48 to a pulse phase analyzer 50. Pulse phase analyzer 50 also receives a reference voltage 52 indicative of the a.c. power signal in cable 14. Spectrum analyzer 42 and pulse phase analyzer 50 are coupled to a controller 54 for controlling operation and providing for automated partial discharge analysis. Controller 54 receives operator input 56, and is coupled to a display 58 for displaying signal information to the operator.

Figure 3A:
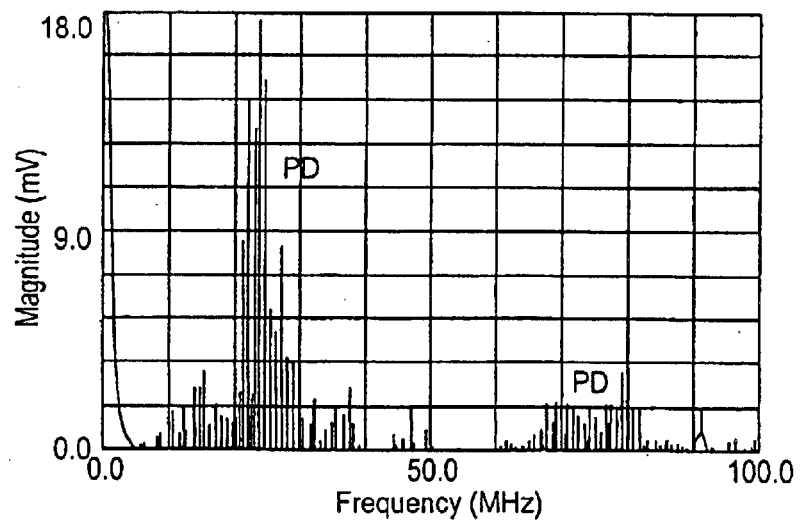
FIGS. 3A, 3B, and 3C are graphic illustrations useful in describing the operation of the invention.

Spectrum analyzer 42 is initially operated in a so-called full span mode for detecting and analyzing input information by amplitude or magnitude as a function of frequency over the entire frequency range set by full span control 44. A typical output of analyzer 42, under full span control in the frequency domain, is illustrated in FIG. 3A. The partial discharge events result in signal peaks at multiple frequencies in the range of 200 KHz to 200 MHZ. In the specific example illustrated in FIG. 3A, the peak of greatest magnitude is at 24 MHz. These peaks or lines are indicative of the partial discharge activity in the cable. It is a characteristic of the electromagnetic pulses generated by partial discharge events that there is more attenuation at the higher frequencies than at the lower frequencies as the signal pulses travel through the cable. Consequently, receipt of signals predominately in the lower frequency range, as illustrated in FIG.

3A, indicates that the insulation anomaly that is causing the partial discharge events is fairly far away from the location of coupler 20. On the other hand, lines or peaks of greater magnitude at the high frequency end of the spectrum would indicate that the insulation anomaly is closer to the inductive coupler. Depending upon the type of cable involved, the apparatus of the present invention can pinpoint the location of the partial discharge activity to within fifty feet.

Figure 3B:
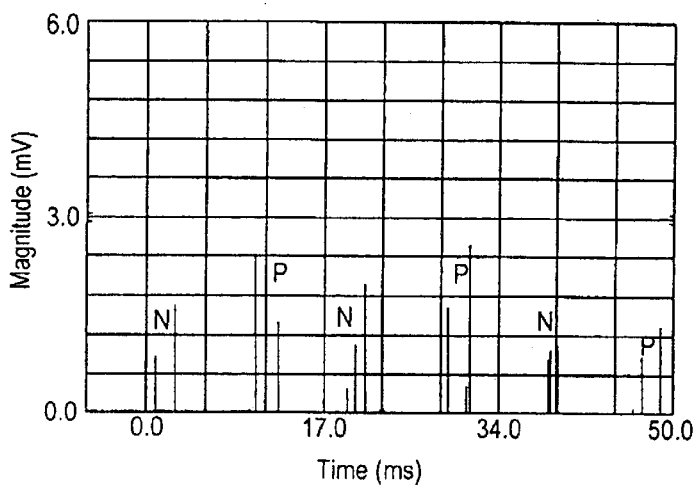

Spectrum analyzer 42 is then operated in the so-called zero span mode to isolate signal activity at one or more of the peaks illustrated in FIG. 3A. For example, FIG. 3B illustrates partial discharge pulse amplitude as a function of time (i.e., in the time domain) at the 24 MHz frequency illustrated in FIG. 3A. The illustration of FIG. 3B has a time duration of 50 milliseconds, which corresponds to three cycles of the sixty Hz power signal in cable 40. It will be seen in FIG. 3B that partial discharge events take place alternately at the positive and negative peaks of the power signal. The occurrence of partial discharge events at both the positive and negative peaks of the power signal indicates that the insulation anomaly in question is near the middle of the insulation between the center conductor and the outer sleeve or shield of the cable. If partial discharge events take place only at the positive peaks of the a.c. signal, this indicates that the insulation anomaly is near the center conductor, while the occurrence of partial discharge events on only the negative peaks indicates that the insulation anomaly is near the shield. Thus, the output of spectrum analyzer 42 in the full-span or frequency domain mode of operation, and in the zero-span or time domain mode of operation, indicates location of the insulation anomaly both longitudinally and radially of the cable.

Figure 3C:
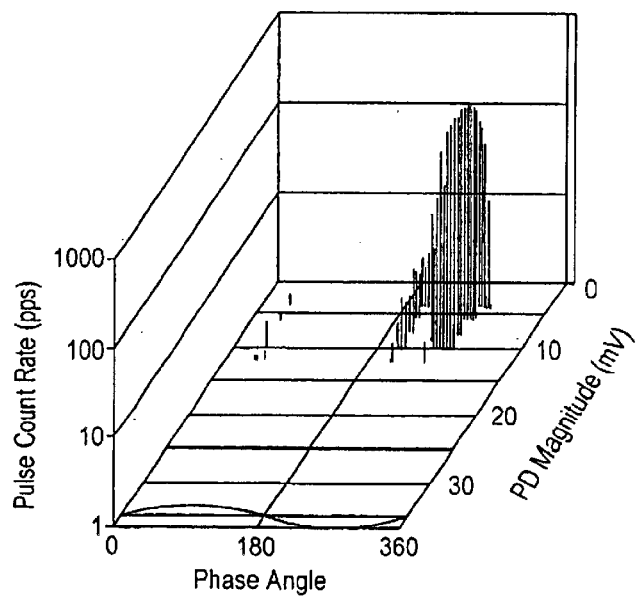

Pulse phase analyzer 50 receives from filter 48 the high frequency electromagnetic pulses generated by the partial discharge events, and receives a reference voltage 52 indicative of the power signal in cable 14. Analyzer 50 analyzes the phase angle of the partial discharge signals versus the reference voltage. FIG. 3C illustrates this relationship of pulse count in pulses per second versus partial discharge magnitude in millivolts versus phase angle. The information provided at pulse phase analyzer 50 helps determine the type of insulation anomaly that causes the partial discharge events. Pulse phase analyzer 50 provides: (1) phase angle data indicating the angle at which partial discharge occurs. For example, if the partial discharge occurs at 90° phase angle, this means that the source of the partial discharge event is in air, such as near the termination ends of the cable; (2) whether partial discharge occurs at the positive, negative or both peaks of the a.c. signal. This helps analyze anomaly type, as discussed above; (3) the pulse magnitude indicates the severity of the problem.

There have thus been disclosed a method and apparatus for on-line detection of partial discharge events in a.c. power systems that distinguish the partial discharges from surrounding electromagnetic interference. Spectrum analyzer 42 analyzes the detected signals as a function of frequency. One or more frequency lines can then be examined in the zero-span mode. Partial discharge signals occur at the peak of the operating voltage, while noise has no pattern to follow in the zero-span mode. When the partial discharge frequencies are identified, the signals at one or more frequencies are analyzed in the time-domain mode. The phase angle pattern analyzed at pulse phase analyzer 50 determines if the partial discharge signal is generated in the equipment under test or adjacent equipment. For example, if the partial discharge events take place at or near 90° phase angle to the a.c. signal, this means that the partial discharges are generated in the cable under test. If the events occur at plus or minus 120° phase angle, this means that the events are occurring in adjacent cables. The pulse count and magnitude at phase angle analyzer 50 are used to indicate the severity of the problem. The filter system disclosed allows discrimination between signals associated with partial discharge events and electromagnetic interference in the surrounding atmosphere.

What is claimed is:

1. A method of on-line analysis of location of partial discharge events during operation of an a.c. power system in which a.c. power is being applied through a cable to a load, comprising the steps of:

(a) detecting in the cable high frequency electromagnetic pulses generated by partial discharge events in the power system caused by continuing application of a.c. power to the system, (b) analyzing said pulses detected in said step (a) in the frequency domain to identify a frequency component of greatest magnitude in said pulses and the frequency of said component, (c) analyzing pulses detected in said step (a) in the time domain at the frequency of said component identified in said step (b) to determine a phase relationship between said frequency component and cycles of the a.c. power in the system, (d) identifying location of partial discharge events in the power system as a function of said frequency component identified in said step (b) and said phase relationship determined in said step (c), (e) determining a phase relationship between pulses detected in said step (a) and the a.c. power being applied to said system, and (f) determining a type of fault in said system that causes said partial discharge events as a function of said phase relationship determined in said step (e).

2. The method set forth in claim 1 wherein said step (a) comprises the step of detecting said pulses within a selected frequency range.

3. The method set forth in claim 2 wherein said step (a) includes filtering said high frequency pulses within said frequency range generated by partial discharge events in the power system against high frequency signals in the surrounding atmosphere.

4. The method set forth in claim 3 wherein said step of filtering said high frequency pulses includes the steps of: (a1) detecting high frequency signals in the surrounding atmosphere within said selected frequency range, and (a2) subtracting said signals detected in said step (a1) from said pulses.

5. The method set forth in claim 4 wherein said selected frequency range includes the VHF frequency range.

* * * * *